United States Patent
Yoo

(10) Patent No.: US 7,916,573 B2
(45) Date of Patent: Mar. 29, 2011

(54) WORD LINE BLOCK/SELECT CIRCUIT WITH REPAIR ADDRESS DECISION UNIT

(75) Inventor: Seong Nyuh Yoo, Seongnam-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 199 days.

(21) Appl. No.: 12/012,931

(22) Filed: Feb. 5, 2008

(65) Prior Publication Data

US 2009/0003118 A1 Jan. 1, 2009

(30) Foreign Application Priority Data

Jun. 27, 2007 (KR) .................. 10-2007-0063935

(51) Int. Cl.
*G11C 8/10* (2006.01)

(52) U.S. Cl. .............. 365/230.06; 365/200; 365/194; 365/225.7; 365/189.07

(58) Field of Classification Search .......... 365/200, 365/230.06, 210.11, 210.1, 194, 191, 189.07, 365/225.7

See application file for complete search history.

(56) References Cited

U.S. PATENT DOCUMENTS

| | | | |
|---|---|---|---|
| 7,099,208 B2 * | 8/2006 | Okuyama et al. | 365/200 |
| 7,106,640 B2 | 9/2006 | Yoon et al. | |
| 7,116,590 B2 | 10/2006 | Blodgett | |
| 2002/0024865 A1 * | 2/2002 | Fujieda et al. | 365/222 |

FOREIGN PATENT DOCUMENTS

| | | |
|---|---|---|
| KR | 10-2002-0010822 A | 2/2002 |
| KR | 10-2005-0037144 A | 4/2005 |

* cited by examiner

*Primary Examiner* — Andrew Q Tran
(74) *Attorney, Agent, or Firm* — John P. White; Cooper & Dunham LLP

(57) ABSTRACT

A word line block select circuit includes a dummy repair logic unit including a dummy logic circuit to output a first control signal and having a delay path for a repair address decision, and a word line activation unit for activating a word line in response to the first control signal and an active command signal.

2 Claims, 6 Drawing Sheets

WORD LINE BLOCK/SELECT CIRCUIT WITH REPAIR ADDRESS DECISION UNIT

BACKGROUND

The present disclosure relates to a semiconductor memory device and, more particularly, to a word line block select circuit.

Generally, when the parameter of tRCD (Row Address to Column Address Delay) is measured, a considerable delay is caused to decide whether to activate a redundancy word line or a normal word line while an active command is input and a word line is activated.

Therefore, many difficulties arise from a time loss and several variables due to a delay tuning for improvement of the tRCD. Accordingly, a processing margin is required for a stable operation in a semiconductor memory device and this margin leads to a tRCD loss.

FIG. 1 is a diagram of a conventional word line block select circuit 100.

As shown in FIG. 1, the conventional word line block select circuit outputs a word line block select signal bs using an active command signal act and a repair control signal repair_sum from a repair address decision unit. That is, the word line block select signal bs is utilized to decide whether to activate a redundancy word line or a normal word line.

Here, the redundancy word line is connected to a dummy cell which is substituted for a bad cell in a memory core. The repair address decision unit decides whether an address signal corresponds to the bad cell or a normal cell.

In FIG. 1, a delay chain 101 is provided for compensating for the time required in the repair address decision unit. Since the time delayed in the repair address decision unit changes according to many variables, the delay chain 101 has an additional delay chain, such as a metal option, in order to compensate for the time delay caused by the variables.

In FIG. 1, in case that a redundancy word line is to be activated by performing a logic operation using both a delayed active signal act_d, which is delayed for time compensation in the delay chain 101, and the repair control signal repair_sum from the repair address decision unit, a logic operation unit 102 outputs the word line block select signal bs which can block a signal path for activating the normal word line and select the redundancy word line.

However, the conventional word line block select circuit has a problem in that the delay chain 101 is formed on the path for activating the normal word line in order to compensate for the time delay caused by the several variables and a processing margin of more than a few nanoseconds is taken.

Also, it is required to correct the metal option in case that the redundancy word line and the normal word line are activated simultaneously due to the lack of the margin. That is, the conventional block select circuit has problems of a tRCD deterioration caused by the margin which is required for a stable operation, and a time loss caused by the metal option correction.

BRIEF SUMMARY

The present disclosure is directed to providing a word line block select circuit capable of reducing a time loss caused by a correction of a metal option and improving the tRCD parameter, by implementing a stable logic circuit which directly affects the tRCD parameter for compensation of time required in a repair address decision unit.

According to an aspect of the present disclosure, there is provided a word line block select circuit comprising a dummy repair logic unit including a dummy logic circuit to output a first control signal and having a delay path for a repair address decision, and a word line activation unit for activating a word line in response to the first control signal and an active command signal. The first control signal is activated when an output signal of the dummy logic circuit is activated. A delay path of the dummy repair logic unit is the same as a delay path of a circuit for the repair address decision.

According to another aspect of the present disclosure, there is provided a word line block select circuit comprising a dummy repair logic unit including a dummy logic circuit to output a first control signal and having a delay path for a repair address decision, a repair address decision unit for performing the repair address decision to decide whether an inputted address is a repair address, a word line block select unit for outputting a word line block select signal in response to an active command signal, the first control signal and an output signal of the repair address decision unit, a normal word line decoder for outputting a decoding signal to drive a normal word line in response to an output signal of the word line block select unit, and a redundancy word line decoder for outputting a decoding signal to drive a redundancy word line in response to the output signal of the repair address decision unit. The first control signal is activated when the output signal of the repair address decision unit is activated. A delay path of the dummy repair logic unit is the same as a delay path of the repair address decision unit.

DESCRIPTION OF EXEMPLARY EMBODIMENTS

Hereinafter, examples and exemplary embodiments of the present invention will be described with reference to the accompanying drawings.

Figure 2:
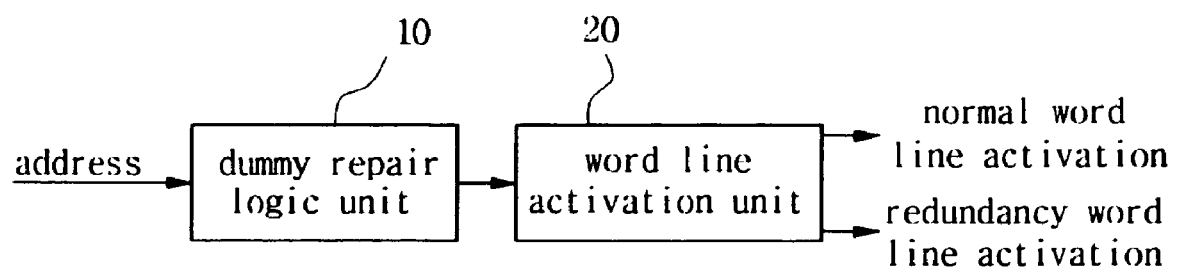
FIG. 2 is a block diagram illustrating a word line block select circuit according to an exemplary embodiment of the present disclosure.

Referring to FIG. 2, a word line block select circuit in the exemplary embodiment of FIG. 2 includes a dummy repair logic unit 10 and a word line activation unit 20. The dummy repair logic unit 10 outputs a dummy repair signal by processing a received address and the outputted dummy repair signal is used as a block select signal of a normal word line or a dummy word line in the word line activation unit 20.

Figure 3:
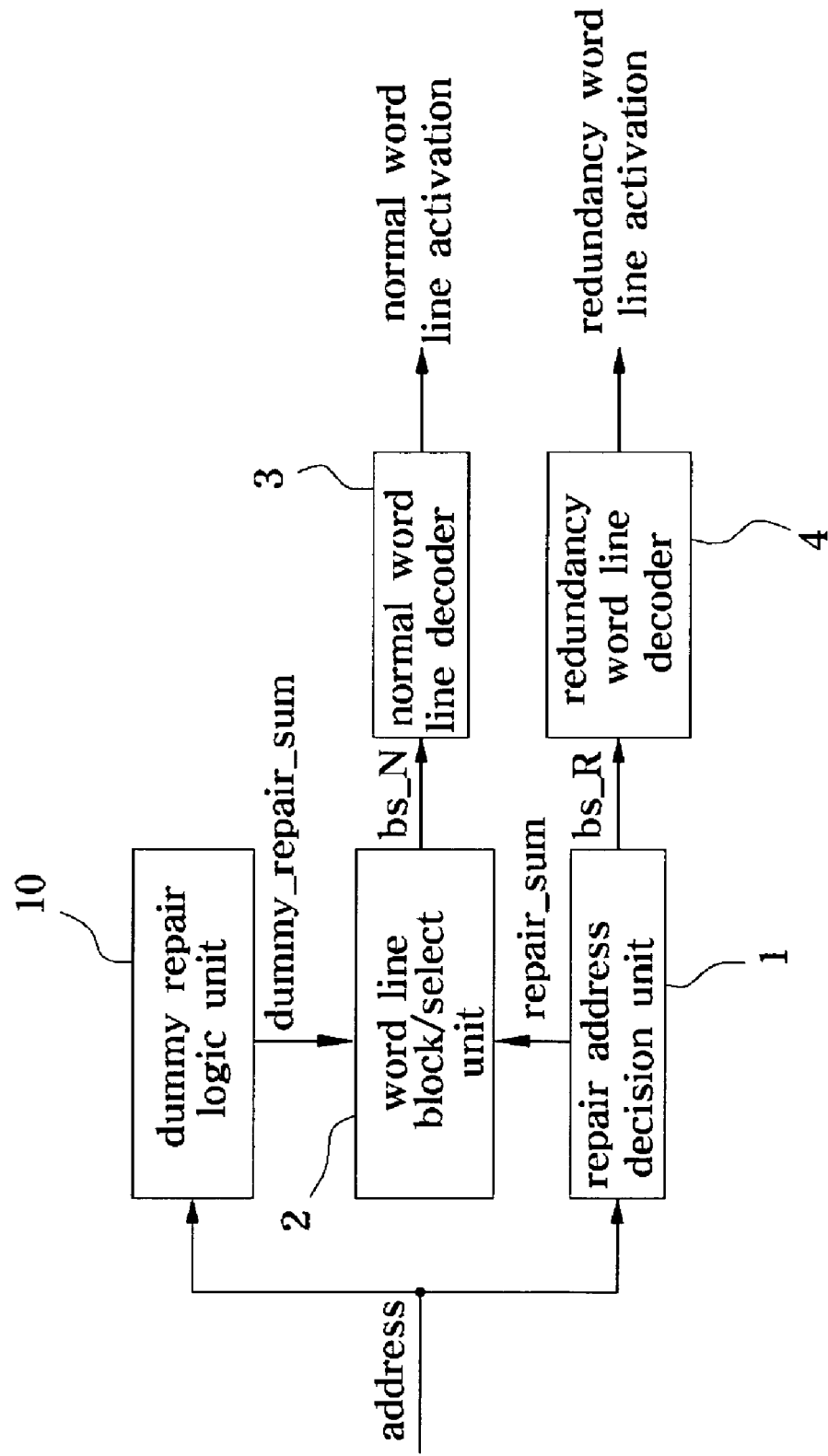
FIG. 3 is a block diagram illustrating a word line block select circuit of FIG. 2.

FIG. 3 is a detailed block diagram illustrating a word line block select circuit of FIG. 2. The word line block select circuit according to the exemplary embodiment of FIG. 3 includes a repair address decision unit 1 which decides whether an inputted address is a repair address, a word line block select unit 2 which outputs a normal word line block select signal bs_N in response to an active command signal act, a dummy repair control signal dummy_repair_sum and a repair control signal repair_sum from the repair address decision unit 1, a normal word line decoder 3 which outputs a decoding signal to drive a normal word line in response to the normal word line block select signal bs_N from the word line block select unit 2, and a redundancy word line decoder 4 which outputs a decoding signal to drive a redundancy word line in response to a dummy word line select signal bs_R from the repair address decision unit 1.

The repair address decision unit 1 provides the repair control signal repair_sum, which is utilized to decide whether an active address corresponds to a bad cell or a normal cell, to the word line block select unit 2.

Figure 4:
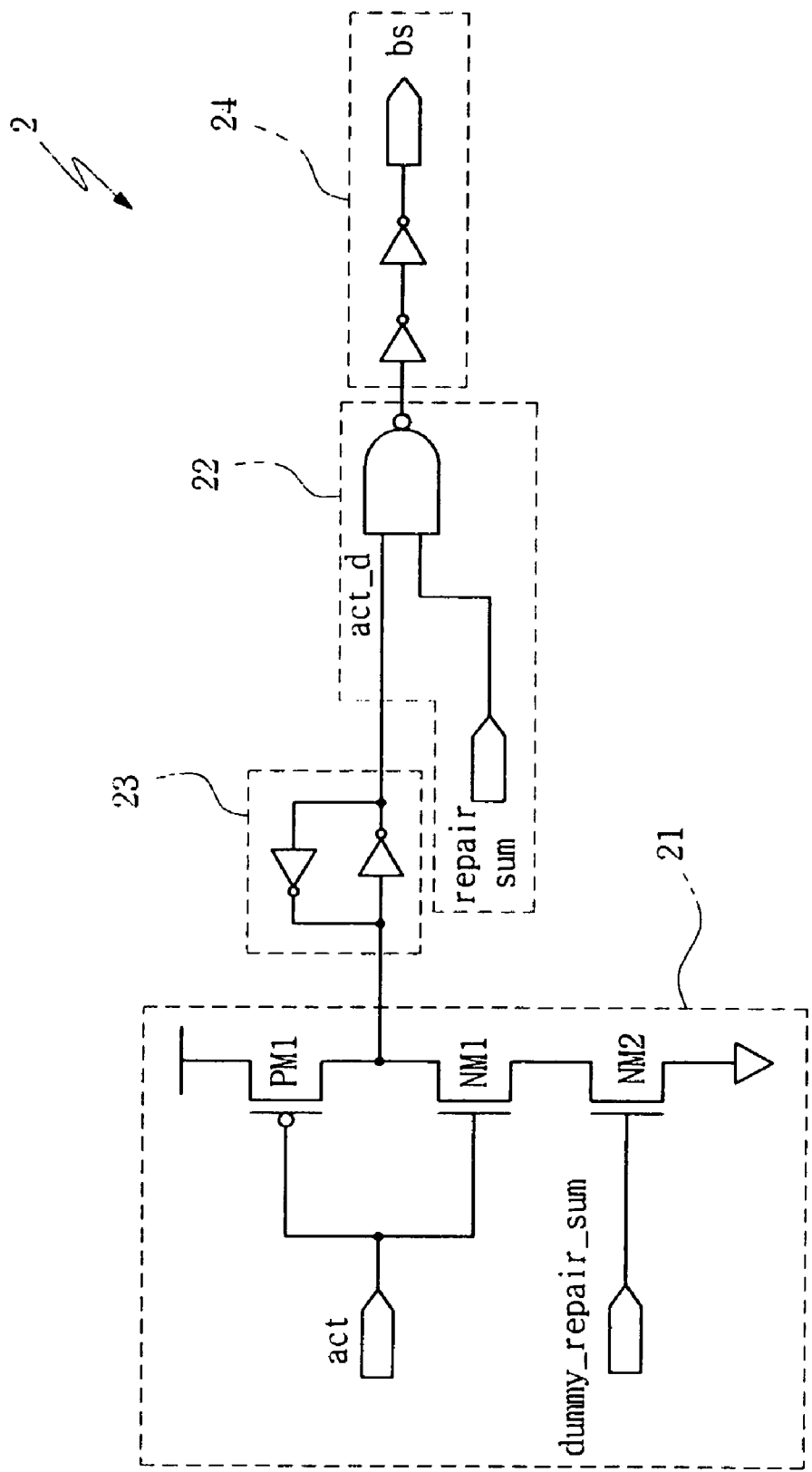
FIG. 4 is a circuit diagram illustrating a word line block select unit of FIG. 3.

As shown in FIG. 4, the word line block select unit 2 includes a control unit 21 which is driven in response to the active command signal act and the dummy repair control signal dummy_repair_sum, and a logic operation unit 22 which performs a logic operation in response to an output signal of the control unit 21 and the repair control signal repair_sum from the repair address decision unit 1.

The control unit 21 includes a first driving unit PM1 which pull-up drives an output node thereof in response to the active command signal act and second driving units Nm1 and NM2 which pull-down drive the output node in response to the active command signal act and the dummy repair control signal dummy_repair_sum, respectively.

The logic operation unit 22 includes a logic element which performs a NAND operation in response to the output signal act_d of the control unit 21 and the repair control signal repair_sum of the repair address decision unit 1.

The word line block select unit 2 also includes a latch unit 23 which latches the output signal of the control unit 21, and a buffer unit 24 which buffers an output signal of the logic operation unit 22.

Figure 5:
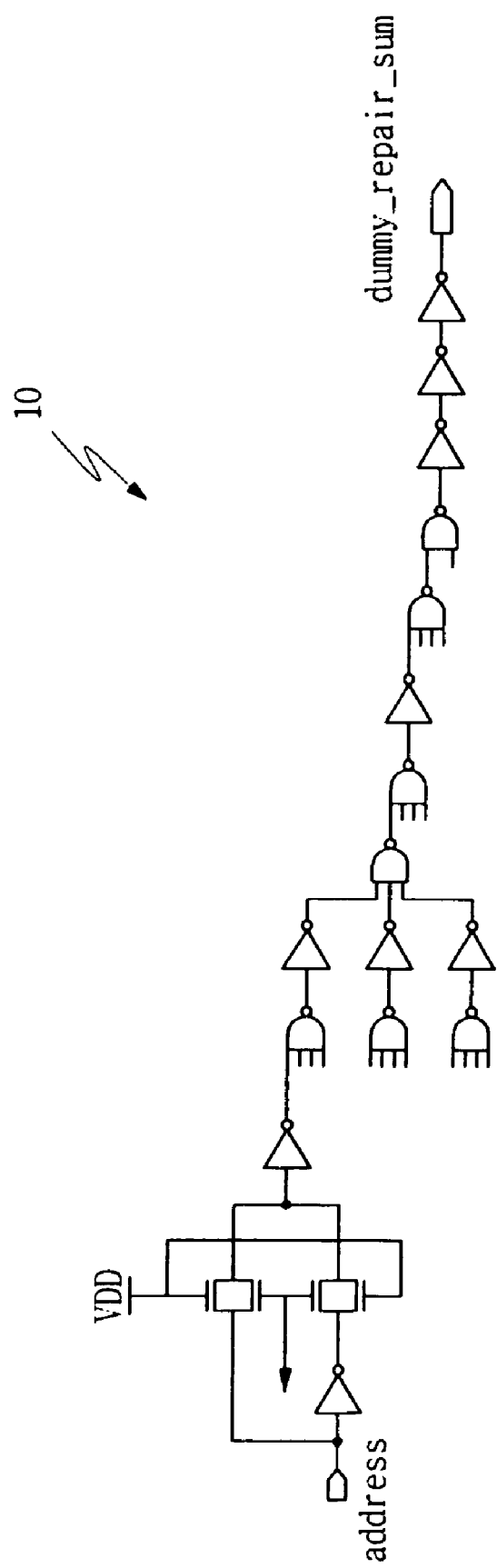
FIG. 5 is a circuit diagram illustrating a dummy repair logic unit of FIG. 3.

As shown in FIG. 5, the dummy repair logic unit 10 configured to generate the dummy repair control signal dummy_repair_sum does not completely reflect all logic configuration of the repair address decision unit 1, and while the dummy repair logic unit is minimized relative to the repair address decision unit 1, a delay path of the dummy repair logic unit 10 is identical to that of the repair address decision unit 1, with consideration of timing and layout constraints.

That is, since a delay path of the dummy repair logic unit 10 is the same as a delay path of the repair address decision unit 1, the dummy repair control signal dummy_repair_sum, which is output from the dummy repair logic unit 10, is activated when the repair control signal repair_sum of the repair address decision unit 1 is activated.

More particularly, in FIG. 4, when a row active command is input, the active command signal act is at a high level. Also, when the signal dummy_repair_sum, namely, an address signal which is input together with the row active command and passes through the dummy repair logic unit 10, is at a high level, the first driving unit NM1 and the second driving unit NM2 are turned on to be at a high level.

At this time, since the delay paths of the two signals act_d and repair_sum are identical, a delay chain for a separate margin is unnecessary.

Figure 6:
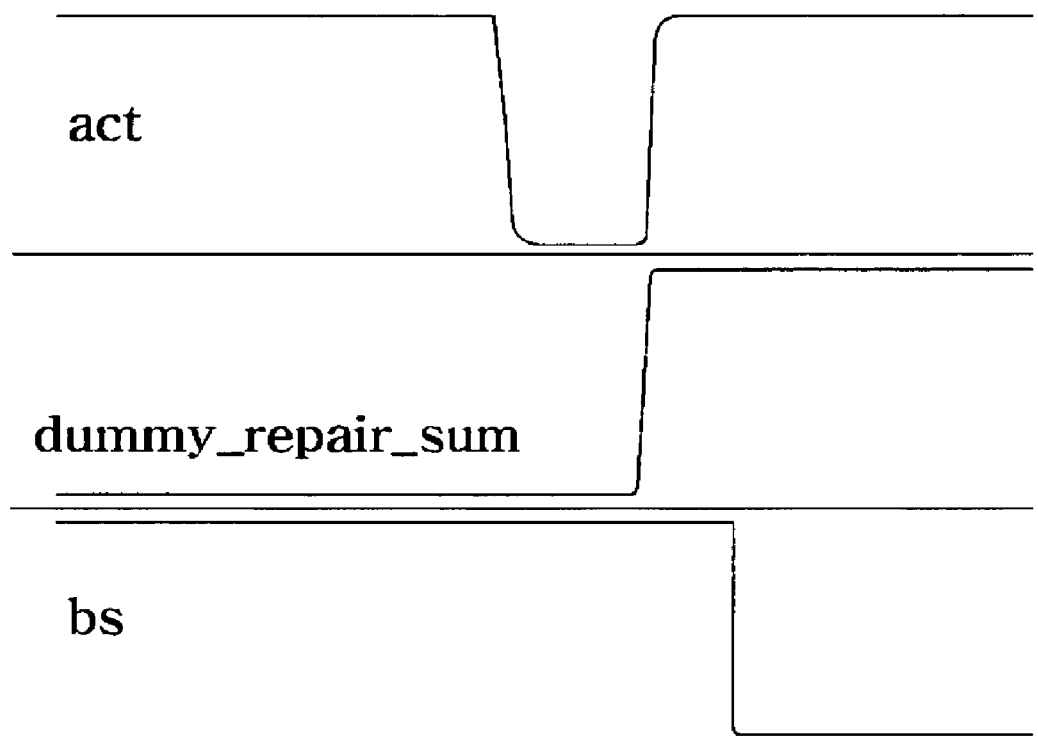
FIG. 6 is a timing chart illustrating an operation of the word line block select unit of FIGS. 2 and 3.

Further, since the delay paths of the two signals act_d and repair_sum are identical, a stable circuit operation is performed regardless of several variables (PVT fluctuations such as process, power source, temperature) and also there is a direct effect of a tRCD improvement, as shown in a simulation result of FIG. 6.

Figure 1:
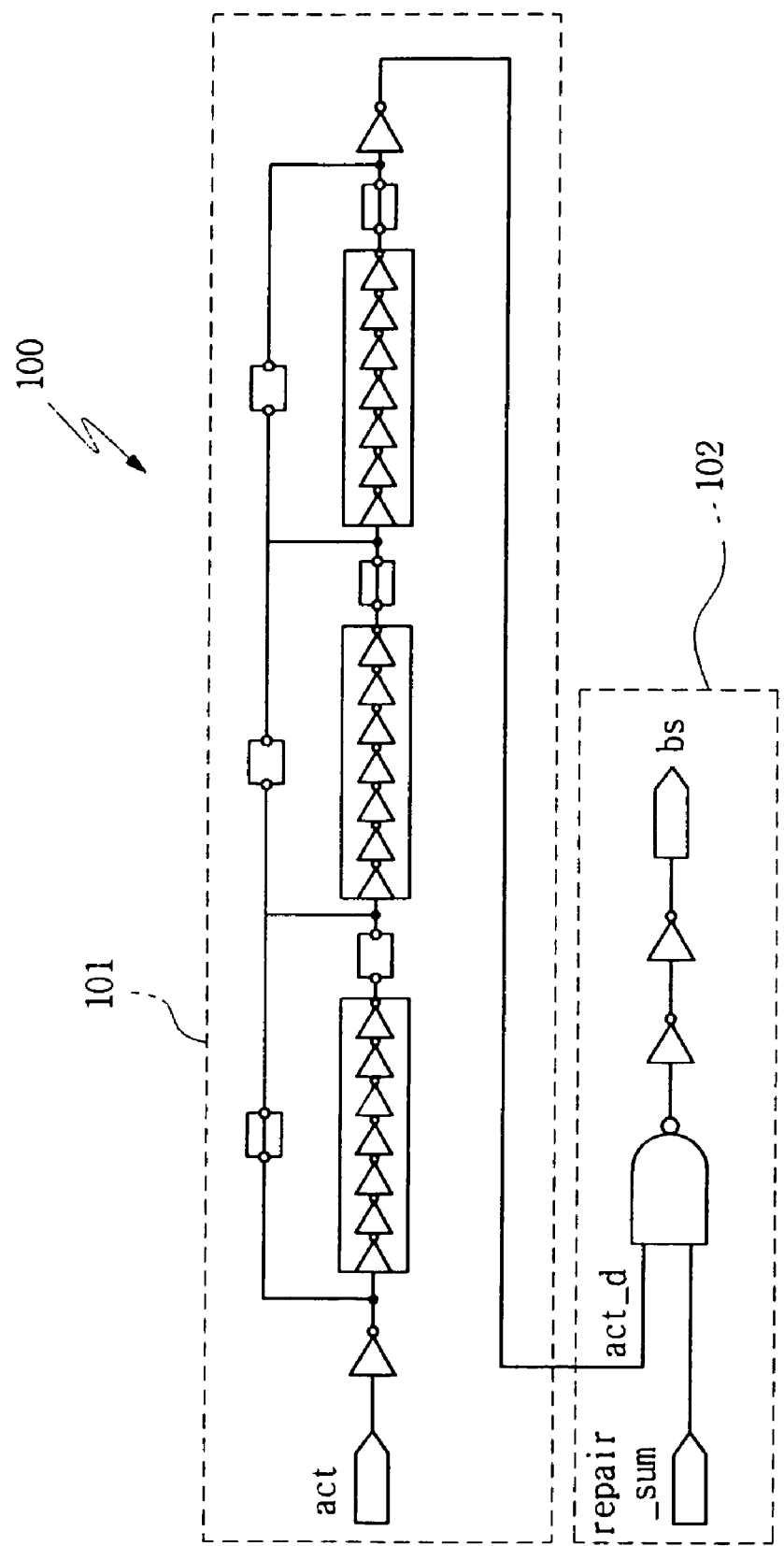
FIG. 1 is a diagram illustrating a conventional word line block select circuit.

Accordingly, in the present invention, a more stable operation can be performed regardless of the PVT fluctuation, and the delay time of a conventional delay chain can be reduced by controlling the path to activate the normal word line using the repair address decision unit, as a dummy logic, instead of the conventional delay chain (for example, reference numeral 101 in FIG. 1), in order to compensate for the delay time required in the repair address decision unit.

Also, the present invention has a direct effect on the tRCD improvement in a process of comparing the signals act_d and repair_sum which pass through different logics, respectively, because the margin necessary for the stable operation is not needed.

Although examples and exemplary embodiments of the present invention have been disclosed for illustrative purposes, those skilled in the art will appreciate that various modifications, additions and substitutions are possible, without departing from the scope and spirit of the disclosure and the accompanying claims.

The present disclosure claims priority to Korean application number 10-2007-63935, filed on Jun. 27, 2007, the entire contents of which are incorporated herein by reference.

What is claimed is:

1. A word line block/select circuit comprising:
    a repair address decision unit configured to generate a repair control signal being activated when an inputted address is a repair address;
    a dummy repair logic unit configured to generate a dummy repair control signal being activated when the repair control signal is activated; and
    a word line block/select unit configured to transfer an active command signal when the dummy repair control signal is activated, and activate a word line when the active command signal is transferred and the repair control signal is activated.

2. The circuit of claim 1, wherein the active command signal is activated when an active command is inputted.

* * * * *